United States Patent
Fang

(10) Patent No.: US 6,192,226 B1
(45) Date of Patent: Feb. 20, 2001

(54) CARRIER SQUELCH PROCESSING SYSTEM AND APPARATUS

(75) Inventor: Jing Fang, Austin, TX (US)

(73) Assignee: Motorola, Inc., Schaumburg, IL (US)

( * ) Notice: Under 35 U.S.C. 154(b), the term of this patent shall be extended for 0 days.

(21) Appl. No.: 09/217,302

(22) Filed: Dec. 21, 1998

(51) Int. Cl.$^7$ ........................ H04B 1/10
(52) U.S. Cl. .................. 455/218; 455/212; 455/296; 375/343
(58) Field of Search ................. 455/212, 213, 455/218, 222, 296, 303, 307, 312; 375/217, 343; 327/307

(56) References Cited

U.S. PATENT DOCUMENTS

| | | | |
|---|---|---|---|
| 3,769,592 | * 10/1973 | Espe | 455/218 |
| 5,297,171 | * 3/1994 | Koch | 375/343 |
| 5,303,408 | * 4/1994 | Ghomeshi et al. | 455/222 |
| 5,970,399 | * 10/1999 | Rostamy et al. | 455/218 |
| 6,055,421 | * 4/2000 | Zele et al. | 455/218 |

FOREIGN PATENT DOCUMENTS 1-130631  5/1989 (JP) .

* cited by examiner

*Primary Examiner*—William G. Trost
*Assistant Examiner*—Lewis West
(74) *Attorney, Agent, or Firm*—Barbara R. Doutre

(57) ABSTRACT

Carrier squelch decisions are made by performing the steps of receiving an input signal (D), free of DC offset, having desired and undesired signal components, extracting the desired signal components (M) from the input signal, weighting a function of the input signal (D) by a function of the desired signal (M) to produce a weighted signal (W), determining a characteristic of the weighted signal (W), and performing carrier squelch when the characteristic exceeds a threshold.

32 Claims, 4 Drawing Sheets

CARRIER SQUELCH PROCESSING SYSTEM AND APPARATUS

FIELD OF THE INVENTION

This invention is generally related to radio communication devices, more particularly related to squelch circuits for use in Frequency Modulated (FM) radio receivers, and specifically related to a simplified, cost effective squelch circuit implementation applicable for both digital and analog radios.

BACKGROUND OF THE INVENTION

Modern radio receivers are typically equipped with a squelch circuit. The general purpose of a carrier squelch circuit is to mute speaker operation within a radio, cellular telephone, or the like, when the carrier strength of a received signal is weak. A typical carrier squelch circuit consists of a front-end processing unit that determines carrier strength and a detection unit that provides speaker mute control. With reference to FIG. 1, the prior art front-end processing unit 100 may include an amplifier stage 104; pre-emphasis filter stage 106; limiter stage 108; high-pass filter stage 110; rectifier stage 112; attenuation stage 114; and low-pass filter stage 116. The detection unit usually includes a comparator stage 118 for comparing the filtered signal with the preset squelch level in the radio. As is known, the squelch level may be controlled by the radio operator.

To perform effectively, the front-end processing unit 100 must overcome the effects of modulation, fading, temperature, and noise, to name a few. As will be appreciated, advanced squelch circuits may therefore include circuitry for the prevention of reception phenomena associated with temporary changes in the RF signal strength.

Since attack time, the time required to detect a signal, and release time, the time required to affirm the absence of a signal, are important design criteria, the circuit of FIG. 1 performs carrier strength detection and estimation in the high frequency region of the received signal (discriminator output) 102. It is generally held that noise levels in the higher frequency regions provide sufficient dynamic range for detection and fast response times during scan operations.

Squelch circuits sharing the above-topology are typically expensive and demand appreciable real estate resources within any device in which they are used. Despite their high cost and size, these circuits are indispensable mainly due to the significant performance benefits they provide. Despite the benefits, subtle problems associated with the prior art approach are that high frequency components are extremely susceptible to the effects of modulation, especially when the modulation index is large and when the modulating signal is strong. In addition, the best high frequency region for noise squelch has proven to be too high to be suitable for use in narrow band FM radios as well as digital radios with low sampling rates.

It would be extremely advantageous therefore to provide a carrier squelch methodology and apparatus that is small in size in comparison to the prior art, minimizes tuning, reduces power consumption, and is suitable for use with narrow band FM radio receivers.

DESCRIPTION OF THE PREFERRED EMBODIMENT

Figure 1:
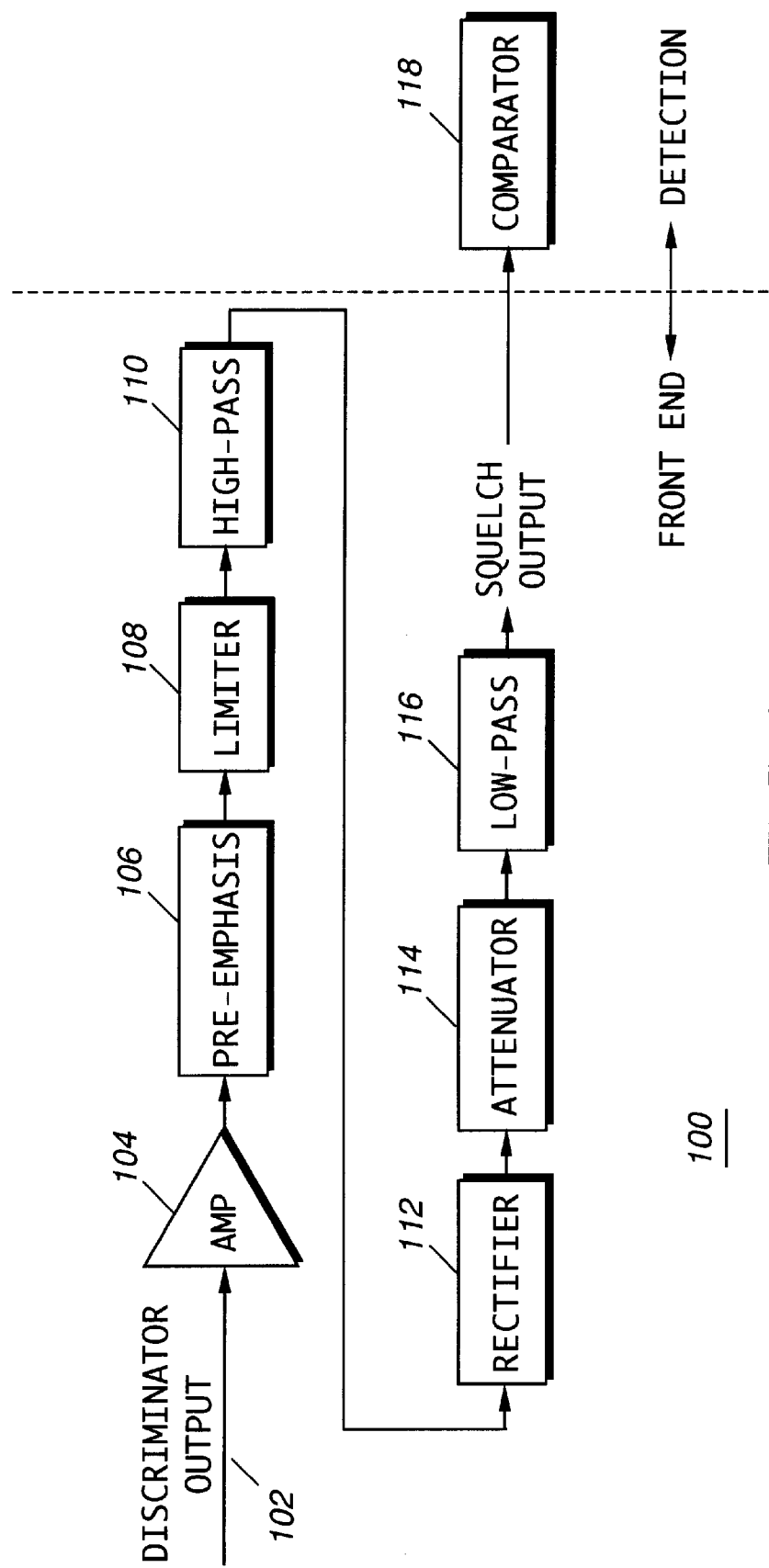
FIG. 1 is a block diagram depicting a prior art squelch circuit as known in the art.

While the specification concludes with claims defining the features of the invention that are regarded as novel, it is believed that the invention will be better understood from a consideration of the following description in conjunction with the drawing figures, in which like reference numerals are carried forward.

One shortcoming exhibited by the traditional prior art squelch circuits relates directly to one of the primary assumptions upon which they are designed; namely, that demodulation noise is more distinguishable between carrier strengths in the high frequency region than in the low- or mid-frequency region. The high frequency components of a received signal are frequently used in noise squelch circuits to determine the squelch decision (whether to squelch or unsquelch the receiver). Unlike the prior art squelch circuit methodologies and topologies, the invention to be described herein relies on a novel concept that a characteristic of the discriminator output, such as energy, in small message signals approximates to characteristics of discriminator noise during the same period of time. By estimating the energy of discriminator output in small message signals, modulation effects on the discriminator noise are minimized, and carrier strength can be predicted.

Figure 2:
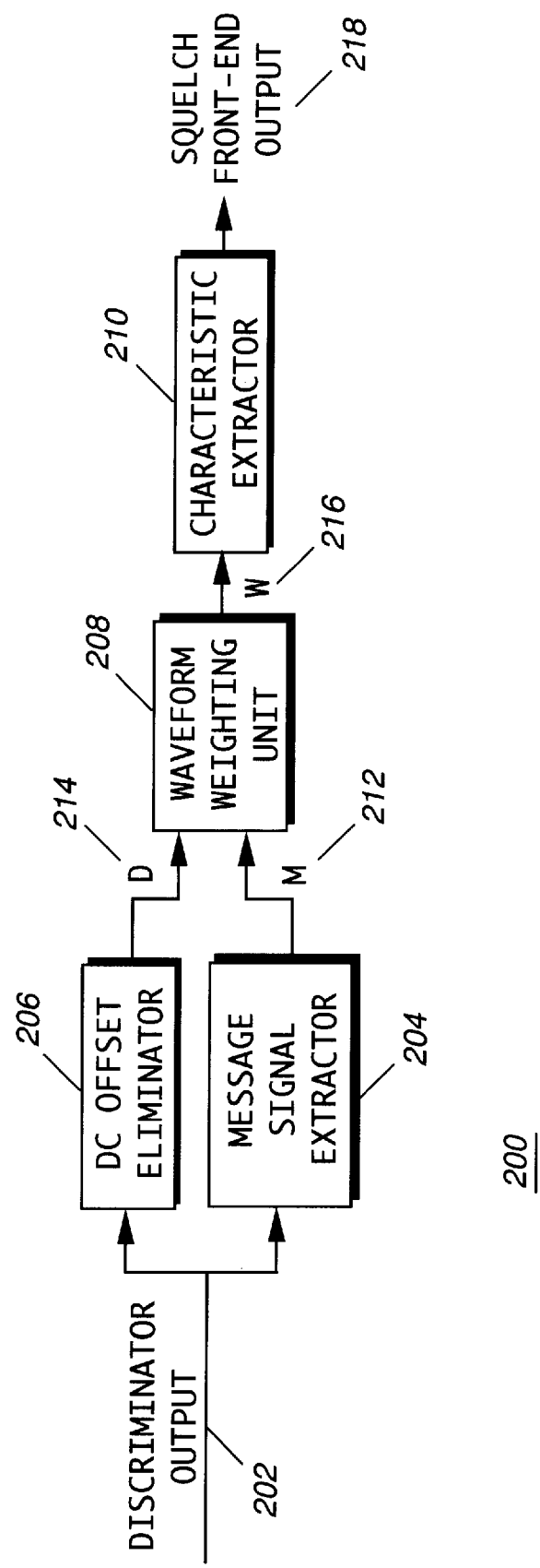
FIG. 2 is a block diagram depicting a squelch circuit in accordance with the present invention.

FIG. 2 is a block diagram of a squelch circuit 200 in accordance with the present invention for use with an analog or digital FM receiver. In accordance with the present invention, system 200 includes a message signal extractor 204, a DC offset eliminator 206, a waveform weighting unit 208, and a characteristic extractor 210. Signal extractor 204 may be implemented using a variety devices, such as a linear phase low-pass or bandpass filter, an autocorrelator, or other similar device. The signal extractor 204 of the present invention extracts a message signal (M) 212, such as audio or tone, from a discriminator output signal 202. The DC offset eliminator 206 removes DC from the discriminator output signal 202 to obtain a signal (D) 214. The waveform weighting unit 208 of the present invention performs a weighting function on signal D relative to signal M to avoid sparse noise collection and generates weighted signal (W) 216.

In accordance with the present invention, the weighting function performed by waveform weighting unit 208 can be accomplished by a variety of functions which generally weigh the input signal (D) inversely proportional to the magnitude of desired signal components $|M|$. For example, a function such as $D/(1+\alpha|M|)$ can be used, where $\alpha$ is a predetermined control parameter. The weighting of the input signal (D) can also be accomplished by the function $|D|/(1+\beta|M|)$, where $\beta$ represents a predetermined control parameter. The input signal (D) can also be weighted by $D\alpha^{-\beta|M|}$, where $\beta$ and $\alpha$ represent predetermined control parameters. The weighting function can also be accomplished by the function $D^2/(1+\beta M^2)$, where $\beta$ is a predetermined control parameter.

The weighted signal (W) 216 is then sent through the characteristic extractor 210 to estimate a characteristic corresponding to carrier strength, such as noise energy or spectral pattern. Characteristic extractor 210 may be composed of a variety of devices depending on which type of characteristic is desired to be extracted from the weighted signal 216. For example, an envelope detector implemented as a rectifier followed by a smoothing filter with a large time constant can be used to determine energy. Filtering the weighted signal (W) 216 allows the frequency band of interest to be isolated, and the energy of the weighted signal within that band of interest to be determined. Alternatively, the weighted signal (W) 216 can be filtered to isolate the frequency band of interest, and a spectral pattern of the weighted signal within that band of interest can be determined. Either the energy of the weighted signal or the spectral pattern of the weighted signal can be used as the characteristic upon which to determine carrier strength and thus base carrier squelch 218 decisions in accordance with the present invention.

Figure 3:
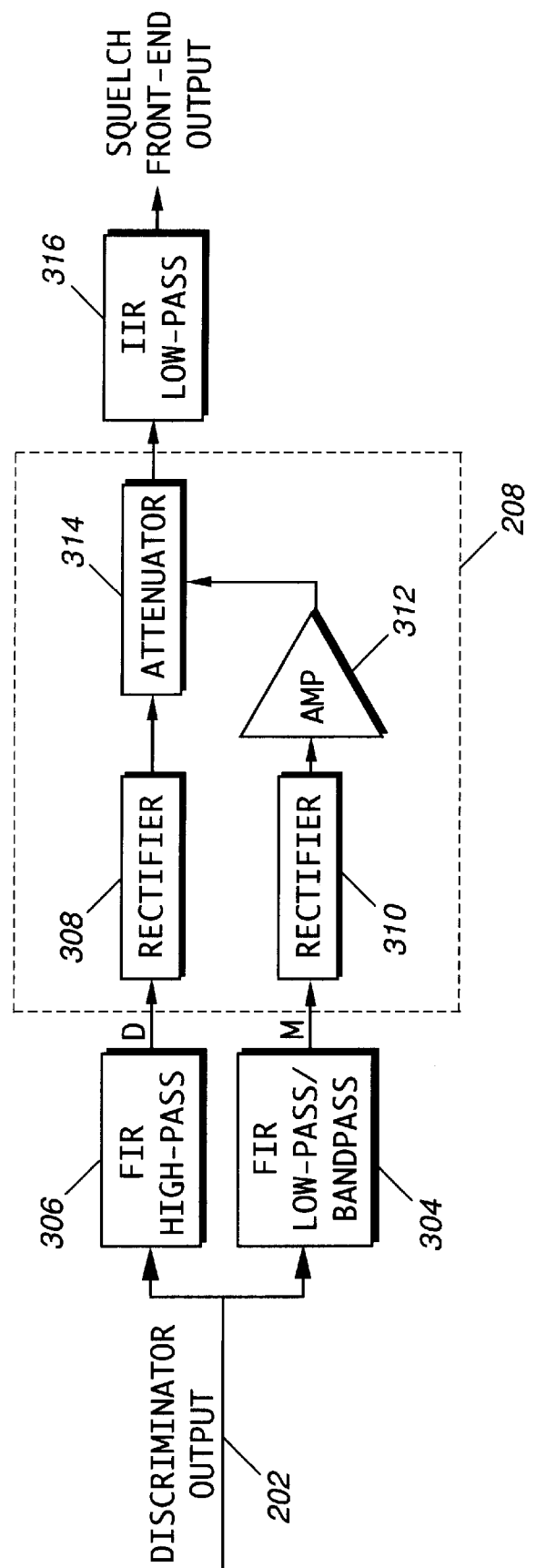
FIG. 3 is a detailed block diagram depicting an embodiment of the squelch circuit of FIG. 2.

Referring next to FIG. 3, a detailed block diagram depicting an embodiment of the squelch circuit of FIG. 2 is shown. System 300 includes a finite impulse response (FIR) low-pass filter 304 to operate as the message signal extractor while a FIR high-pass filter 306 operates as the DC offset eliminator. The waveform weighting unit 208 of FIG. 2 is implemented here by two rectifiers 308, 310, an amplifier/gain element 312, and attenuator 314. The characteristic extractor 210 of FIG. 2 is realized here by an infinite impulse response (IIR) low-pass filter 316.

Referring back to FIG. 2, in accordance with the present invention, the front end processing system 200 of the present invention removes the nonlinear modulation effect by first extracting the M from the input (i.e. discriminator output), then preserving D when the carrier is less deviated (i.e. when the signal is small) or weighting D heavily otherwise, and finally quantitatively estimating the characteristics, such as energy or spectral pattern, to predict carrier strength.

Figure 4:
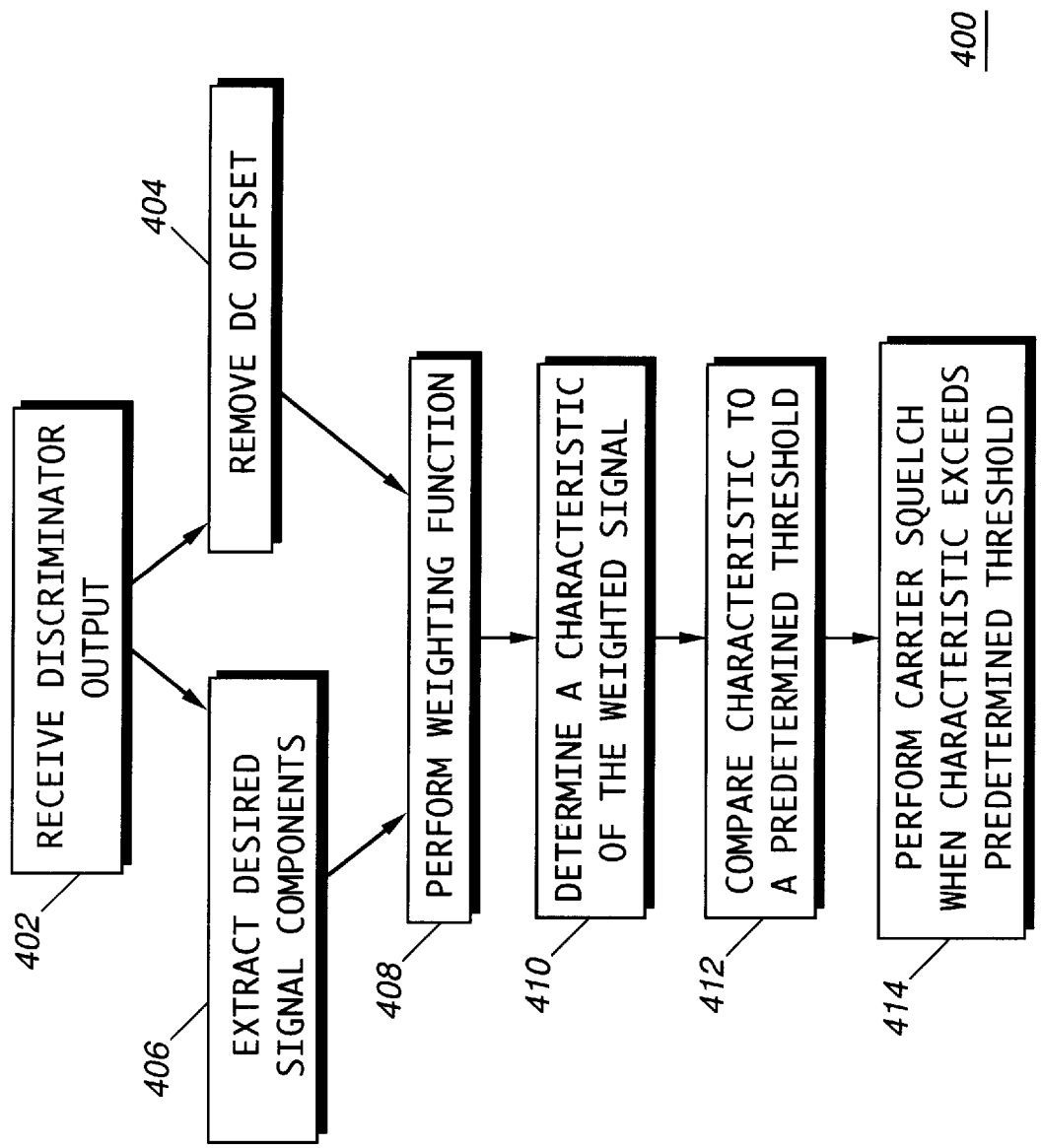
FIG. 4 is a flowchart of the steps performed by a device performing squelch processing and detection in accordance with the present invention.

FIG. 4 is a flowchart 400 of the steps performed by a device performing squelch processing and detection in accordance with the present invention. At step 402 the discriminator output is received as the input signal. Any DC offset is removed at step 404 while desired signal components are extracted and step 406. The DC offset removal of step 404 can be accomplished by filtering the input signal or by obtaining a difference between the input signal and a delayed version of the input signal, over time. The step of extracting signal components can be accomplished by filtering or autocorrelating the input signal.

A weighting function is then performed at step 408 which weights a function of the input signal (D) by a function of the desired signal (M) to produce a weighted signal (W). A characteristic of the weighted signal is then determined at step 410. Step 410 can be accomplished by filtering the weighted signal to isolate a frequency band of interest, and determining the energy of the weighted signal within that band of interest. Alternatively, step 410 can be accomplished by filtering the weighted signal to isolate a frequency band of interest, and determining a spectral pattern of the weighted signal within that band of interest. At step 412, the characteristic is then compared to a predetermined threshold, and carrier squelch is performed at step 414 when the characteristic exceeds that predetermined threshold.

Alternatively, the steps of weighting and determining a characteristic can be exchanged. In this alternative method, steps 402, 404, and 406 are maintained and then the step of determining a characteristic is performed on the signal (D) (i.e. the signal that has the DC removed). Characteristics such as energy or filtered energy can be determined on the signal (D). Next, a weighting function is performed on the determined characteristic by a function of the desired signal (M) to produce a weighted signal (W). Carrier squelch is then performed when the weighted characteristic exceeds a predetermined threshold.

Accordingly, there has been provided a carrier squelch methodology and apparatus that estimates characteristics of the discriminator output in small message signals, so that modulation effects on the discriminator noise are minimized, and carrier strength can be predicted. The carrier squelch methodology and apparatus of the present invention provide the advantage of low power consumption, minimal tuning, and are suitable for use with narrow band FM radio receivers.

What is claimed is:

1. A method for performing carrier squelch, comprising the steps of:

receiving an input signal (D), free of DC offset, having desired and undesired signal components;

extracting the desired signal components (M) from the input signal;

weighting a function of the input signal (D) by a function of the desired signal (M) to produce a weighted signal (W);

determining a characteristic of the weighted signal (W) which corresponds to carrier strength; and performing carrier squelch when the characteristic exceeds a predetermined threshold.

2. The method of claim 1, wherein the step of weighting further comprises the step of weighting the input signal inversely proportional to the magnitude of desired signal components.

3. The method of claim 1, wherein the step of weighting further comprises the steps of:

weighting the input signal (D) by the function $D/(1+\beta|M|)$, where $\beta$ is a predetermined control parameter.

4. The method of claim 1, wherein the step of weighting further comprises the step of:

weighting the input signal (D) by the function $D\alpha^{-\beta|M|}$, where $\beta$ and $\alpha$ are predetermined control parameters.

5. The method of claim 1, wherein the step of weighting further comprises the steps of:

weighting the input signal (D) by the function $D^2/(1+\beta M^2)$, where $\beta$ is a predetermined control parameter.

6. The method of claim 1, wherein the step of extracting the desired signal further comprises the step of:

filtering the input signal to remove undesired signal components.

7. The method of claim 1, wherein the step of extracting the desired signal further comprises the step of:

autocorrelating the input signal to remove undesired signals components.

8. The method of claim 1, wherein the step determining a characteristic of the weighted signal further comprises the steps of:

filtering the weighted signal to isolate a frequency band of interest; and determining the energy of the weighted signal within the band of interest.

9. The method of claim 1, wherein the step determining a characteristic of the weighted-signal further comprises the steps of:

filtering the weighted signal to isolate a frequency band of interest; and determining a spectral pattern of the weighted signal within the band of interest.

10. The method of claim 1, wherein the step of determining a characteristic of the weighted signal further comprises the step of determining a characteristic selected from the group consisting of:
  energy of the weighted signal; and
  a spectral pattern of the weighted signal.

11. A method for performing carrier squelch comprising the steps of:
  receiving an input signal having desired and undesired signal components;
  extracting the desired signal components (M) from the input signal;
  removing DC offset components from the input signal to generate a signal (D), free of DC offset;
  weighting a function of the signal (D) by a function of the signal (M) to produce a weighted signal (W);
  determining a characteristic of the weighted signal (W) which corresponds to carrier strength; and
  performing carrier squelch when the characteristic exceeds a predetermined threshold.

12. The method of claim 11, wherein the step of weighting further comprises the steps of:
  weighting the input signal inversely proportional to the magnitude of the desired signal components.

13. The method of claim 11, wherein the step of weighting further comprises the step of:
  weighting the input signal (D) by the function $D/(1+\beta|M|)$, where $\beta$ is a predetermined control parameter.

14. The method of claim 11, wherein the step of weighting further comprises the step of:
  weighting the input signal (D) by the function $D\alpha^{-\beta|M|}$, where $\beta$ and $\alpha$ are predetermined control parameters.

15. The method of claim 11, wherein the step of weighting further comprises the step of:
  weighting the input signal (D) by the function $D^2/(1+\beta M^2)$, where $\beta$ is a predetermined control parameter.

16. The method of claim 1 wherein the step of extracting the desired signal further comprises the step of:
  filtering the input signal to remove undesired signal components.

17. The method of claim 11, wherein the step of extracting the desired signal-further comprises the step of:
  auto correlating the input signal to remove undesired signals components.

18. The method of claim 11, wherein the step of removing DC offset components further comprises the step of:
  filtering the input signal to eliminate DC offset components.

19. The method of claim 11, wherein the step of removing DC offset components ether comprises the step of:
  obtaining a difference between the input signal and a delayed version of the input signal, over time.

20. The method of claim 11, wherein the step of determining a characteristic of the weighted signal further comprises the steps of:
  filtering the weighted signal to isolate a frequency band of interest; and
  determining the energy of the weighted signal within the band of interest.

21. The method of claim 11, wherein the step of determining a characteristic of the weighted signal further comprises the steps of:
  filtering the weighted signal to isolate a frequency band of interest; and
  determining a spectral pattern of the weighted signal within the band of interest.

22. The method of claim 11, wherein the step of determining a characteristic of the weighted signal further comprises the step of determining a characteristic selected from the group consisting of:
  energy of the weighted signal, and
  a spectral pattern of the weighted signal.

23. A method for performing carrier squelch comprising the steps of:
  receiving an input signal having desired and undesired signal components;
  extracting the desired signal components (M) from the input signal;
  removing DC offset components from the input signal to generate a signal, (D), free of DC offset;
  determining a characteristic of the signal (D);
  weighting a function of the characteristic by a function of the signal (M) to produce a weighted signal (W); and
  performing carrier squelch when the weighted characteristic exceeds a predetermined threshold.

24. The method of claim 23, wherein the step of determining a characteristic of the signal (D) comprises the step of:
  determining the energy of the signal (D).

25. The method of claim 23, wherein the step of determining a characteristic of the signal (D) comprises the step of:
  determining the filtered energy of the signal (D).

26. A carrier squelch circuit for a radio, comprising:
  a DC offset eliminator for receiving a discriminator output signal and generating a signal (D) free of DC offset;
  a message signal extractor for receiving the discriminator output signal and extracting a message signal (M);
  a waveform weighting unit for weighting a function of the signal (D) by a function of the message signal (M) to produce a weighted signal (W);
  a characteristic extractor for determining a characteristic of the weighted signal (W) corresponding to carrier strength and a means for performing carrier squelch when the characteristic exceeds a predetermined threshold.

27. A carrier squelch circuit as described in claim 26, further comprising a detection unit for comparing the characteristic of the weighted signal to a predetermined threshold.

28. A carrier squelch circuit as described in claim 27, wherein the DC offset eliminator comprises a finite impulse response (FIR) high-pass filter.

29. A carrier squelch circuit as described in claim 28, wherein the message signal extractor comprises a finite impulse response (FIR) low-pass filter.

30. A carrier squelch circuit as described in claim 28, wherein the message signal extractor comprises a finite impulse response (FIR) bandpass filter.

31. A carrier squelch circuit as described in claim 29, wherein the waveform weighting unit comprises:
  a first rectifier coupled to the FIR high-pass filter;
  an attenuator coupled to the first rectifier; and
  a second rectifier coupled to the FIR low-pass filter;
  an amplifier coupled between the second rectifier and the attenuator.

32. A carrier squelch circuit as described in claim 31, wherein an envelope detector comprises an infinite impulse response (IIR) low-pass filter coupled to the attenuator.

* * * * *